United States Patent
Konishi

(10) Patent No.: US 8,629,710 B2
(45) Date of Patent: Jan. 14, 2014

(54) SENSOR OUTPUT IC AND SENSOR DEVICE

(75) Inventor: Yasuchika Konishi, Kusatsu (JP)

(73) Assignee: OMRON Corporation, Kyoto (JP)

( * ) Notice: Subject to any disclaimer, the term of this patent is extended or adjusted under 35 U.S.C. 154(b) by 484 days.

(21) Appl. No.: 12/977,955

(22) Filed: Dec. 23, 2010

(65) Prior Publication Data

US 2011/0221479 A1  Sep. 15, 2011

(30) Foreign Application Priority Data

Mar. 12, 2010  (JP) .................................. 2010-056628

(51) Int. Cl.
*H01L 35/00* (2006.01)

(52) U.S. Cl.
USPC ........................................................ 327/512

(58) Field of Classification Search
USPC ........................... 327/365, 369, 371, 512, 513
See application file for complete search history.

(56) References Cited

U.S. PATENT DOCUMENTS

| | | | |
|---|---|---|---|
| 5,457,419 A * | 10/1995 | Tihanyi | 327/378 |
| 5,638,021 A * | 6/1997 | Kaifler et al. | 327/513 |
| 6,218,889 B1 * | 4/2001 | Fujiki et al. | 327/427 |
| 6,335,577 B1 | 1/2002 | Baba | |
| 6,671,152 B1 * | 12/2003 | Hersel et al. | 361/93.8 |
| 6,759,891 B2 * | 7/2004 | Dotson | 327/512 |
| 7,113,019 B2 * | 9/2006 | Nadd et al. | 327/512 |
| 8,159,284 B2 * | 4/2012 | Ball | 327/513 |
| 2004/0070910 A1 | 4/2004 | Gergintschew | |
| 2004/0228058 A1 | 11/2004 | Mayama et al. | |
| 2007/0103006 A1 | 5/2007 | Zushi et al. | |

FOREIGN PATENT DOCUMENTS

| | | |
|---|---|---|
| EP | 1804383 A2 | 7/2007 |
| JP | 02-156721 A | 6/1990 |

OTHER PUBLICATIONS

European Extended Search Report for European Application No. 10189085.3-2215, Dated Jul. 1, 2011 (6 Pages).
English abstract of JP02-156721 published on Jun. 15, 1990, 1 page.

* cited by examiner

*Primary Examiner* — Jeffrey Zweizig
(74) *Attorney, Agent, or Firm* — Osha Liang LLP

(57) ABSTRACT

A sensor output IC has a switching element that turns on and off between output terminals based on a detection signal from a sensor, and a temperature-limiting circuit that maintains the switching element in an off state when a temperature at the sensor output IC becomes a predetermined value or more.

13 Claims, 5 Drawing Sheets

SENSOR OUTPUT IC AND SENSOR DEVICE

BACKGROUND OF THE INVENTION

1. Technical Field

The present invention relates to a sensor output IC including a switching element that turns on and off between output terminals based on a detection signal from a sensor, and a sensor device.

2. Related Art

FIG. 6 illustrates a schematic configuration of a general sensor system that performs various operations based on a detection signal from a sensor. As illustrated in FIG. 6, a sensor system 100 has a configuration in which a power supply 111 and a load 112 are connected to a sensor device 110. The power supply 111 is connected to power supplying terminals 113 and 113 of the sensor device 110 to supply an electric power to the sensor device 110. The load 112 performs various operations based on a detection signal from a sensor 120 (described below) by the supply of the electric power, and the power supply 111 and the load 112, connected in series, are connected to output terminals 114 and 114.

In FIG. 6, one side of the power supplying terminals 113 and one side of the output terminals 114 constitute a common ground terminal GND. Hereinafter, positive sides of the power supplying terminal 113 and the output terminal 114 are referred to as a power supplying terminal $V_{CC}$ and an output terminal OUT, respectively.

The sensor device 110 includes the sensor 120 and a sensor output IC (Integrated Circuit) 121. The sensor 120 detects physical or chemical information, and a proximity sensor and a photoelectric sensor can be cited as an example of the sensor 120. The detection signal detected with the sensor 120 is inputted to the sensor output IC 121.

In the sensor output IC 121, output terminals 122 and 122 are connected to the output terminals OUT and GND of the sensor device 110, respectively. The sensor output IC 121 includes a switching element 123 that turns on and off between the output terminals 122 and 122 based on the detection signal from the sensor 120. Therefore, the supply of the electric power from the power supply 111 to the load 112 is turned on and off, which allows the operation of the load 112 to be controlled based on the detection of the sensor 120.

In the sensor system 100 illustrated in FIG. 6, when the load 112 is short-circuited while the switching element 123 becomes an on state, possibly an excess current is passed through the switching element 123 to lead to a malfunction. Therefore, conventionally a load-short-circuit protection function of protecting the switching element 123 from the malfunction even if the load 112 is short-circuited is provided in the sensor device 110.

For example, Japanese Unexamined Patent Publication No. 2-156721 (published on Jun. 15, 1990) discloses a short-circuit protection circuit that forcedly turns off the switching element 123 for a second predetermined time interval when detected that the excess current of a predetermined value or more is continuously passed through the switching element 123 for a first predetermined time interval. In the Japanese Unexamined Patent Publication No. 2-156721, a timer circuit is used to determine whether or not the first and second predetermined time intervals have elapsed. Additionally, there is well known a technique of using a divided frequency of a clock frequency of a logic circuit.

However, for the use of the timer circuit, it is necessary to provide a circuit element having a capacitance or a resistance outside the sensor output IC 121, which results in a circuit scale and production cost being increased in the sensor device 110. For the use of the logic circuit, it is necessary to provide the logic circuit in the sensor output IC 121, which results in a process of producing the sensor output IC 121 being limited to an expensive one to increase the production cost. Thus, the conventional short-circuit protection circuit becomes troublesome in further achieving the miniaturization and low cost of the sensor device 110.

SUMMARY

One or more embodiments of the present invention provides a sensor output IC in which the load-short-circuit protection function is realized while the circuit scale and production cost of the sensor device are reduced than ever before.

In accordance with one aspect of the present invention, a sensor output IC includes a switching element that turns on and off between output terminals based on a detection signal from a sensor and a temperature-limiting circuit that maintains the switching element in an off state when a temperature at the sensor output IC becomes a predetermined value or more.

When the load is short-circuited while the switching element is in the on state, the excess current is passed to generate heat, and a temperature at the sensor output IC is raised. Therefore, in one or more embodiments of the present invention, the temperature-limiting circuit maintains the switching element in the off state when the temperature becomes the predetermined value or more. Therefore, the heat generation of the switching element is stopped, so that the switching element can be protected from the malfunction.

Frequently a semiconductor element, such as a transistor, which is incorporated in the IC has a temperature characteristic. Accordingly, the temperature-limiting circuit can detect whether or not the temperature is the predetermined value or more by utilizing the semiconductor element having the temperature characteristic, and the temperature-limiting circuit can perform the above-described operation. In order to realize the load-short-circuit protection function, it is not necessary in the sensor output IC 10 to externally connect a component or to internally provide a logic circuit. Therefore, the circuit scale and the production cost can be reduced than ever before.

The sensor may be provided outside the sensor output IC or be incorporated in the sensor output IC.

The sensor output IC according to one or more embodiments of the present invention may further include a driving circuit that supplies a driving current to the switching element or stops the supply of the driving current based on the detection signal, wherein the switching element becomes the on state when the driving current is supplied, while the switching element becomes the off state when the supply of the driving current is stopped, and the temperature-limiting circuit may perform control so as to stop an operation of the driving circuit when the temperature becomes the predetermined value or more.

In such cases, the temperature-limiting circuit stops the operation of the driving circuit when the temperature becomes the predetermined value or more. Therefore, the driving current is not supplied from the driving circuit to the switching element irrespective of the detection signal, so that the switching element can be maintained in the off state to obtain the same effect as that described above.

The cause that the switching element malfunctions due to the short circuit of the load is attributed to the heat generation and a current concentration. The malfunction due to the heat generation is generated when a temperature at the switching element rises as time advances. On the other hand, the malfunction due to the current concentration is instantaneously generated when the current passed through the switching element exceeds a maximum value.

Accordingly, the circuit that limits the current passed through the switching element in the on state is desirably provided to protect the switching element from the malfunction due to the current concentration. Specifically, the sensor output IC according to one or more embodiments of the present invention further includes a voltage-limiting circuit that limits the driving voltage to a predetermined value or less, wherein the current passed through the switching element in the on state is determined by a driving voltage applied to the switching element.

In such cases, the voltage-limiting circuit can limit the driving voltage to limit the current passed through the switching element in the on state. Accordingly, the switching element can securely be protected from the malfunction.

In the sensor output IC according to one or more embodiments of the present invention, the temperature-limiting circuit performs control so as to resume the operation of the driving circuit when a detected temperature becomes another predetermined value that is lower than the predetermined value. In such cases, until the temperature becomes the predetermined value or less and further becomes another predetermined value or less, the operation of the driving circuit remains stopped, and the switching element is maintained in the off state, so that the switching element can sufficiently be cooled. Accordingly, the switching element can securely be protected from the malfunction.

In the sensor output IC according to one or more embodiments of the present invention, the temperature-limiting circuit is disposed adjacent to the switching element. In such cases, a period until it is detected that the temperature becomes the predetermined value or more since the excess current is passed through the switching element and heat is generated can be shortened because the temperature detected with the temperature-limiting circuit becomes close to the temperature at the switching element. Accordingly, the switching element can securely be protected from the malfunction.

Herein, examples of the switching element include a transistor.

The same effect as that described above can be obtained as long as a sensor device includes a sensor and the sensor output IC having the above-described configuration.

In the sensor output IC according to one or more embodiments of present invention, the semiconductor element having the temperature characteristic is utilized to maintain the switching element in the off state when the temperature at the sensor output IC becomes the predetermined value or more, whereby the switching element is protected from the malfunction. Therefore, in one or more embodiments of the present invention, it is not necessary in the sensor output IC to externally connect a component or to internally provide a logic circuit, so that the circuit scale and the production cost can advantageously be reduced than ever before.

DETAILED DESCRIPTION

Hereinafter, one or more embodiments of the present invention will be described with reference to FIGS. 1 to 3. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Because a schematic configuration of a sensor system is similar to that of a conventional sensor system 100 illustrated in FIG. 6, the description thereof will not be given.

Figure 1:
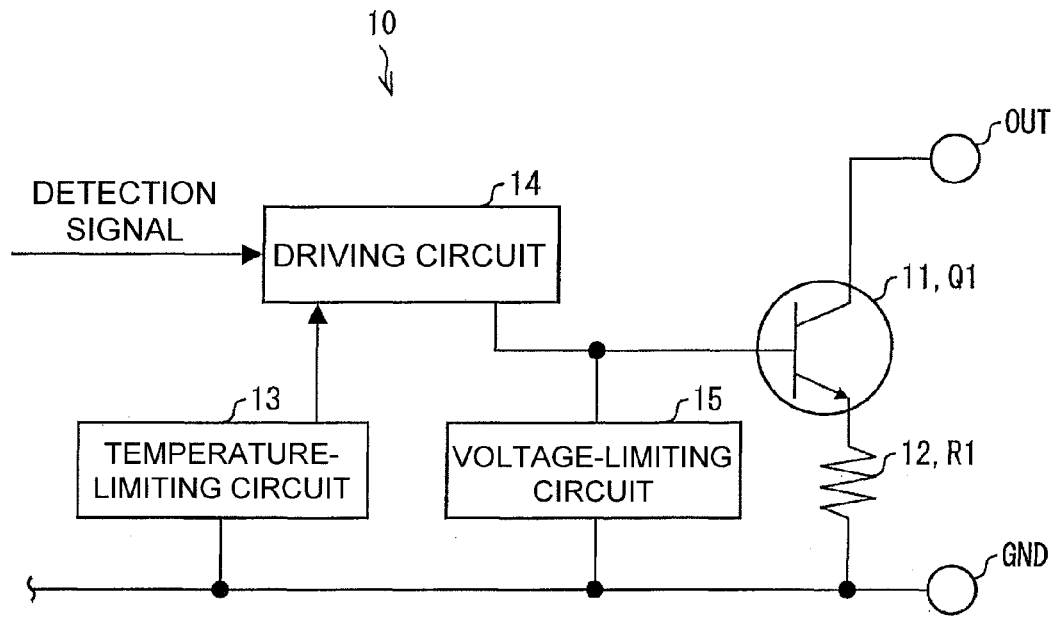
FIG. 1 is a block diagram illustrating a schematic configuration of a sensor output IC according to one or more embodiments of the present invention.

FIG. 1 illustrates a schematic configuration of a sensor output IC 10 according to one or more embodiment of the present invention. As illustrated in FIG. 1, the sensor output IC 10 includes an output transistor (Q1) 11, a resistor (R1) 12, a temperature-limiting circuit 13, a driving circuit 14, and a voltage-limiting circuit 15.

Figure 6:
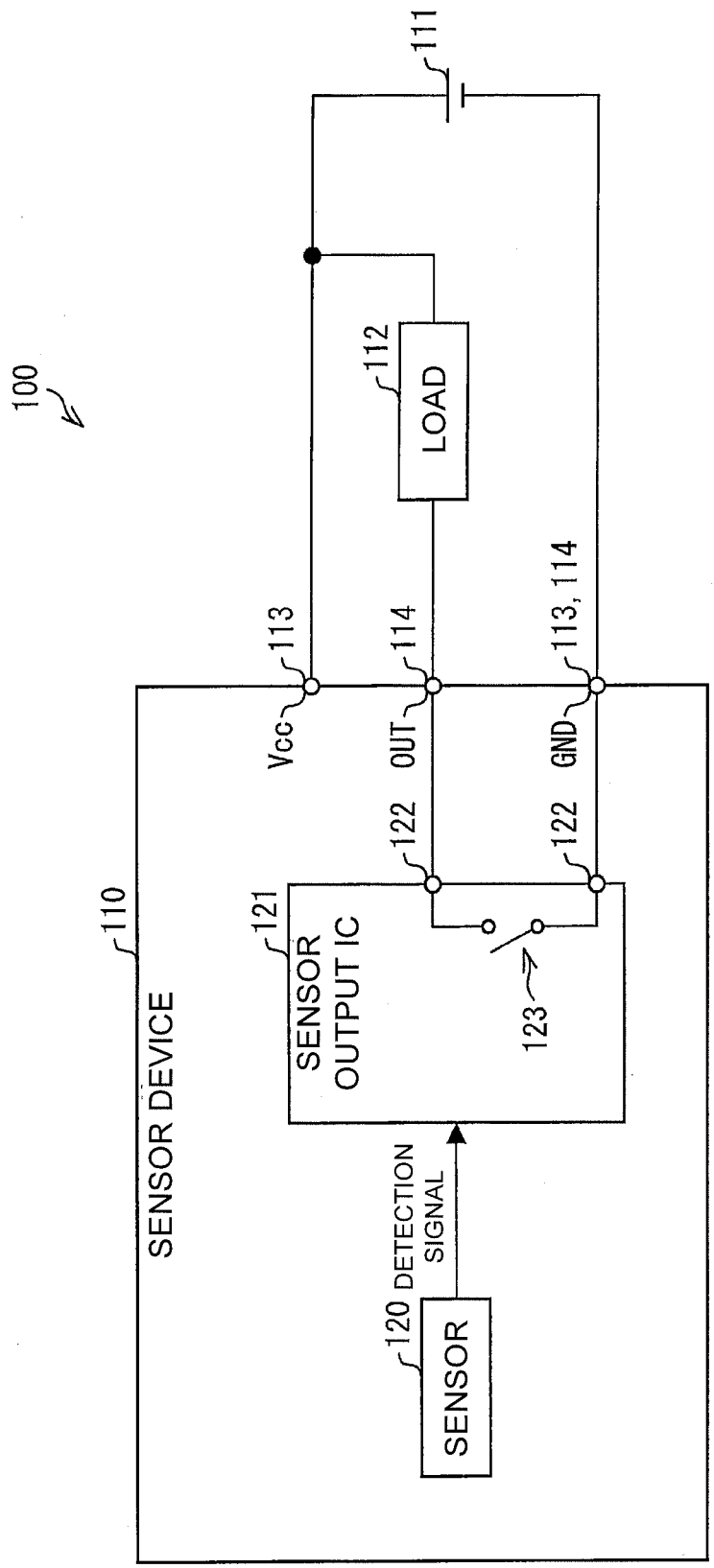
FIG. 6 is a block diagram illustrating a schematic configuration of a general sensor system.

The output transistor 11 acts as the switching element 123 illustrated in FIG. 6. In the NPN output transistor 11 in FIG. 1, a collector terminal is connected to an output terminal OUT, a base terminal is connected to the driving circuit 14 and the voltage-limiting circuit 15, and an emitter terminal is connected to a ground terminal GND through a resistor 12. The output transistor 11 performs on and off operations based on an electric signal from the driving circuit 14.

The temperature-limiting circuit 13 provides an instruction to stop the operation of the driving circuit 14 when a temperature around the output transistor 11 becomes a first predetermined value or more. The temperature-limiting circuit 13 has a hysteresis function of providing an instruction to resume the operation of the driving circuit 14 when the temperature becomes a second predetermined value or less that is lower than the first predetermined value.

The driving circuit 14 controls supply of a driving current for driving the output transistor 11 from the off state to the on state based on a detection signal from a sensor 120. Specifically, the driving circuit 14 supplies a predetermined driving current to the base terminal of the output transistor 11 when the output transistor 11 is put into the on state by the detection signal. On the other hand, the driving circuit 14 stops the supply of the driving current when the output transistor 11 is put into the off state by the detection signal.

The driving circuit 14 stops and resumes the operation in response to the instruction from the temperature-limiting circuit 13. When the driving circuit 14 stops the operation, the output transistor 11 becomes the off state because the supply of the driving current to the output transistor 11 is stopped irrespective of the detection signal.

The voltage-limiting circuit 15 limits a potential (base potential) $V_B$ at the base terminal of the output transistor 11 to a predetermined value or less. The output transistor 11 becomes the off state when the base-emitter voltage $V_{BE}(Q1)$ is lower than a threshold, and the output transistor 11 is put into the on state when the base-emitter voltage $V_{BE}(Q1)$ becomes the threshold or more. In the on state, the base potential $V_B$ and current $I_{out}$ of the output transistor 11 satisfy the following equation:

$$V_B = V_{BE}(Q1) + I_{out} \times R1 \quad \text{(Equation 1)}.$$

In the output transistor 11, the base-emitter voltage $V_{BE}$ (Q1) is not largely changed even if the current $I_{out}$ passed through the output transistor 11 is changed. Therefore, the current $I_{out}$ passed through the output transistor 11 is determined by the base potential $V_B$, that is, the voltage (driving voltage) $V_B$ between the ground terminal GND and the base terminal of the output transistor 11.

When an excess current is passed through the output transistor 11 such that the load is short-circuited, the voltage-limiting circuit 15 limits the base potential $V_B$ to a predetermined value or less, which allows the limitation of the current $I_{out}$ passed through the output transistor 11. Therefore, the output transistor 11 can be protected from the malfunction caused by the current concentration.

In the sensor output IC 10 having the above-described configuration, when the output transistor 11 is in the on state while the load is short-circuited, the excess current is passed through the output transistor 11 to generate heat, thereby raising the temperature at the sensor output IC 10. At this point, the temperature-limiting circuit 13 stops the operation of the driving circuit 14 when the temperature becomes a predetermined value or more. Therefore, the output transistor 11 is maintained in the off state, because the driving current is not supplied to the output transistor 11 from the driving circuit 14 irrespective of the detection signal. Therefore, the output transistor 11 can be protected from the malfunction, because the heat generation is stopped in the output transistor 11.

The temperature-limiting circuit 13 can detect whether or not the temperature becomes the predetermined value or more by utilizing a semiconductor element having a temperature characteristic, and the temperature-limiting circuit 13 can perform the above-described operation. In order to realize the load-short-circuit protection function, it is not necessary in the sensor output IC 10 to externally connect a component or to internally provide a logic circuit. Therefore, the circuit scale and the production cost can be reduced than ever before.

The temperature-limiting circuit 13 has the hysteresis function, so that the output transistor 11 can sufficiently be cooled. Accordingly, the output transistor 11 can securely be protected from the malfunction.

Figure 2:
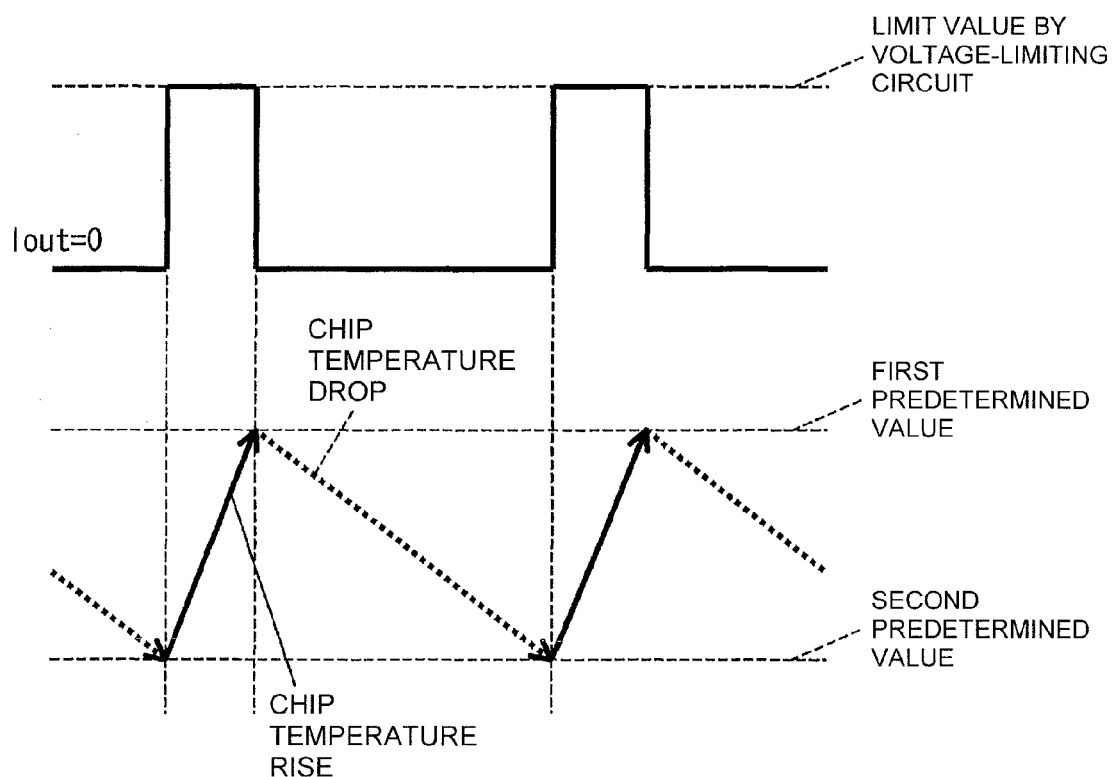
FIG. 2 is a graph illustrating temporal changes of a current passed through an output transistor and a temperature at the sensor output IC when a load is short-circuited in the sensor output IC.

FIG. 2 is a graph illustrating temporal changes of the current $I_{out}$ passed through the output transistor 11 and the temperature at the sensor output IC 10 when the load is short-circuited in the sensor output IC 10 having the above-described configuration. In FIG. 2, it is assumed that the detection signal is inputted from the sensor 120 such that the output transistor 11 becomes the on state.

As illustrated in FIG. 2, the output transistor 11 becomes the on state to pass the current $I_{out}$ through the output transistor 11, and the chip temperature at the sensor output IC 10 is raised. At this point, the voltage-limiting circuit 15 limits the current $I_{out}$ to a limited value.

When the chip temperature reaches a first predetermined value, the output transistor 11 becomes the off state. Therefore, the chip temperature is gradually lowered. When the chip temperature reaches a second predetermined value, the operation of the driving circuit 14 is resumed to put the output transistor 11 into the on state, and the operation is repeated.

Figure 3:
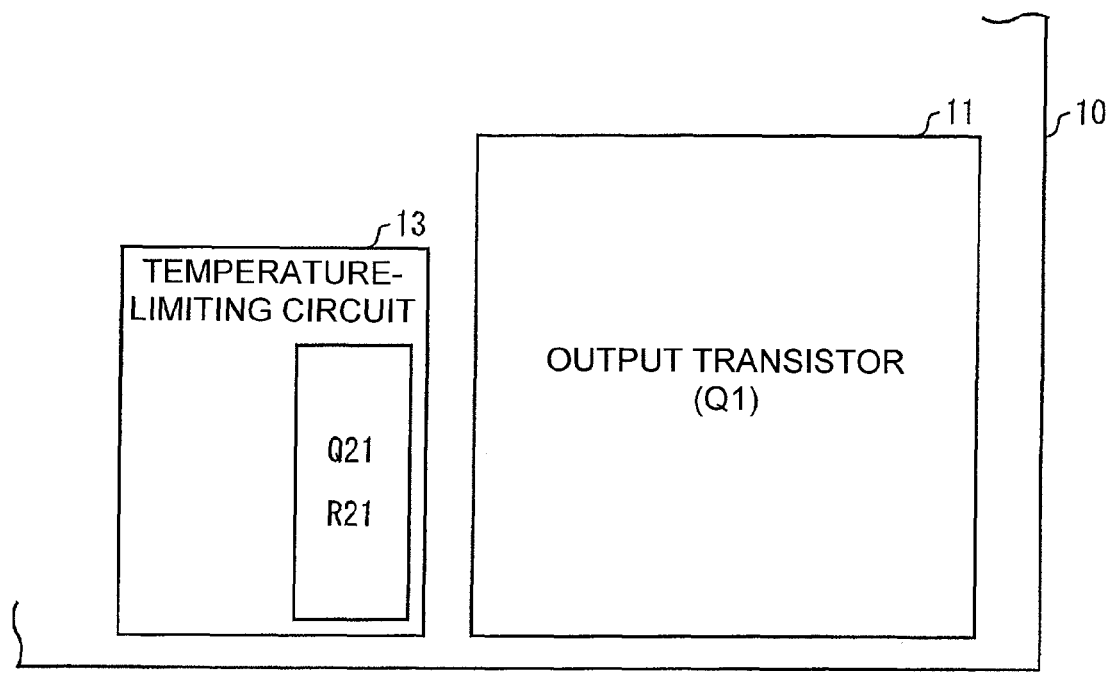
FIG. 3 is a plan view illustrating a positional relationship between the output transistor and a temperature-limiting circuit in the sensor output IC.

FIG. 3 illustrates a disposition example of the output transistor 11 and the temperature-limiting circuit 13 in the sensor output IC 10. As illustrated in FIG. 3, desirably the temperature-limiting circuit 13 is disposed adjacent to the output transistor 11. In such cases, the period until it is detected that the temperature becomes the predetermined value or more since the excess current is passed through the output transistor 11 and heat is generated can be shortened because the temperature detected with the temperature-limiting circuit 13 becomes close to the temperature at the output transistor 11. Accordingly, the output transistor 11 can securely be protected from the malfunction. In the temperature-limiting circuit 13, more desirably elements (a transistor Q21 and a resistor R21 which will be described below) used to detect the temperature are provided on the side closer to the output transistor 11.

First Example

Figure 4:
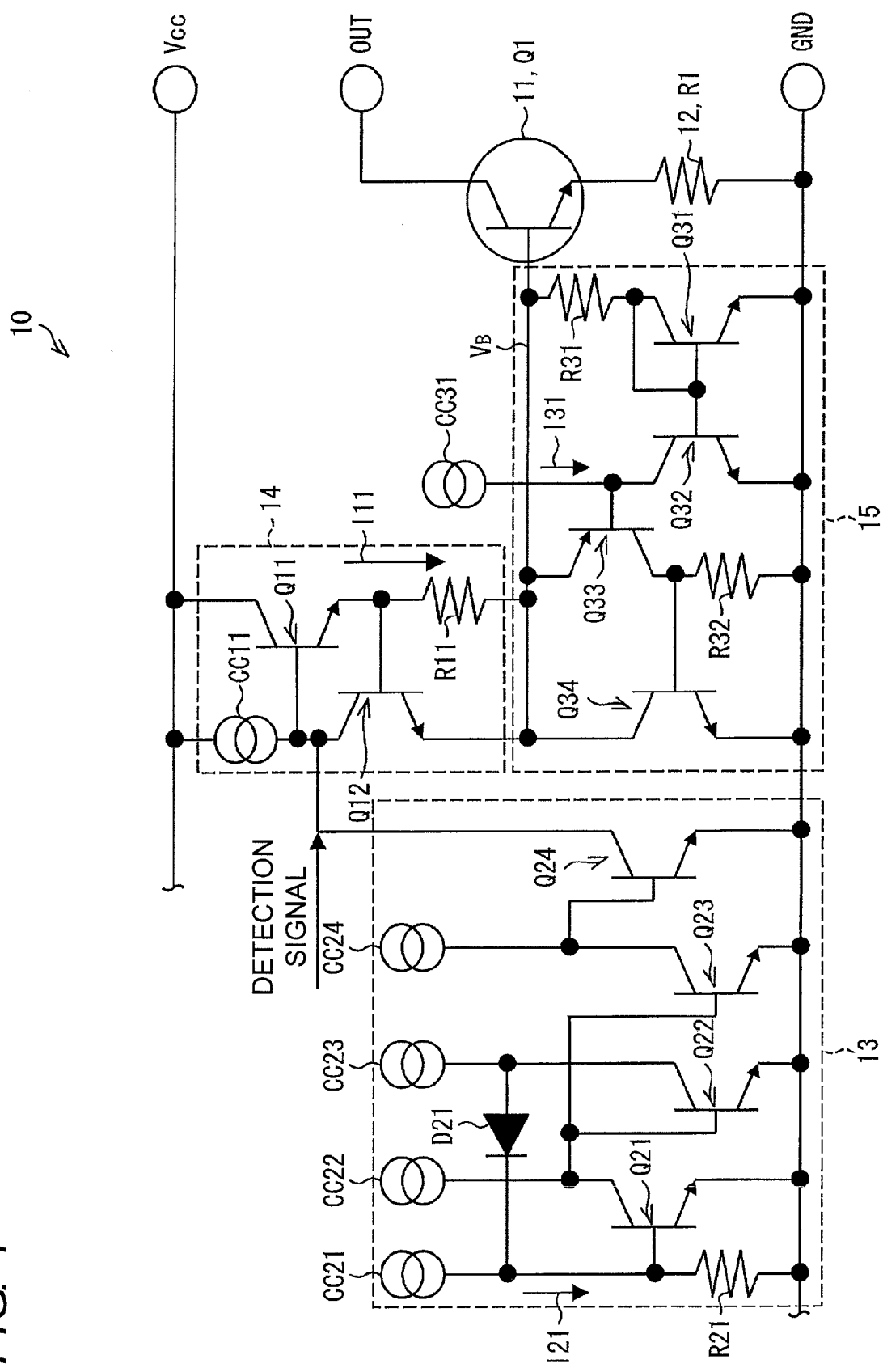
FIG. 4 is a circuit diagram illustrating a first example of the sensor output IC.

FIG. 4 illustrates a first example of a circuit of the sensor output IC 10 of FIG. 1. First an example of the driving circuit 14 in the sensor output IC 10 will be described. As illustrated in FIG. 4, the driving circuit 14 includes a constant current source CC11, NPN transistors Q11 and Q12, and a resistor R11.

In the transistor Q11, the collector terminal is connected to a power supplying terminal $V_{CC}$, the detection signal is inputted to the base terminal from the sensor 120, and the emitter terminal is connected to the base terminal of the output transistor 11 through the resistor R11. In the transistor Q12, the collector terminal is connected to the constant current source CC11 and the base terminal of the transistor Q11, the base terminal is connected to the emitter terminal of the transistor Q11, and the emitter terminal is connected to the base terminal of the output transistor 11.

When the current is supplied from the constant current source CC11 to the transistors Q11 and Q12 in response to the detection signal, the transistor Q11 becomes the on state to supply a driving current I11 to the base terminal of the output transistor 11. At this point, $I11 = V_{BE}(Q12)/R11$ is obtained. As used herein, $V_{BE}(Q12)$ means a base-emitter voltage of the transistor Q12. On the other hand, when the current is not supplied from the constant current source CC11 to the transistors Q11 and Q12 in response to the detection signal, the transistor Q11 becomes the off state to stop the supply of the driving current I11.

Then, an example of the temperature-limiting circuit 13 in the sensor output IC 10 will be described. As illustrated in FIG. 4, the temperature-limiting circuit 13 includes constant current sources CC21, CC22, CC23, and CC24, NPN transistors Q21, Q22, Q23, and Q24, a resistor R21, and a diode D21.

In the circuit of FIG. 4, the transistor Q21 and the resistor R21 detect that the temperature at the sensor output IC 121 becomes the predetermined value or more. In the first example, the base-emitter voltage $V_{BE}$ of the transistor Q21 has the negative temperature characteristic, and the resistor R21 has the positive temperature characteristic.

The constant current source CC21 is connected to the base terminal of the transistor Q21, and the constant current source CC22 is connected to the collector terminal of the transistor Q21 and the base terminals of the transistors Q22 and Q23. The constant current source CC23 is connected to the collector terminal of the transistor Q22 and connected to the base terminal of the transistor Q21 through the diode D21. The constant current source CC24 is connected to the collector terminal of the transistor Q23 and the base terminal of the transistor Q24.

The base terminal of the transistor Q21 is connected to the ground wire GND through the resistor R21. The collector terminal of the transistor Q24 is connected to the base terminal of the transistor Q11 of the driving circuit 14. In all the transistors Q21 to Q24, the emitter terminals are connected to the ground wire GND.

Accordingly, an output terminal OUT is short-circuited to the power supplying terminal $V_{CC}$ to pass the large current through the output transistor 11, the heat is generated in the output transistor 11 to raise the temperature at the sensor output IC 10. At this point, $V_{BE}(Q21)$ is decreased and R21 is increased. It is assumed that the currents from the constant current sources CC21 to CC24 are substantially independent of the temperature.

When the temperature becomes the first predetermined value or more, the transistor Q21 becomes the on state to pass the current from the constant current source CC22 to the transistor Q21, thereby putting the transistors Q22 and Q23 into the off state. Therefore, the current is passed from the constant current source CC24 to the transistor Q24 to put the transistor Q24 into the on state. Therefore, the current is passed from the constant current source CC11 of the driving circuit 14 to the transistor Q24 to put the transistor Q11 into the off state. As a result, because the driving current I11 is not supplied to the base terminal of the output transistor 11, the output transistor 11 becomes the off state.

When the transistor Q22 becomes the off state, the current is supplied from the constant current source CC23 to the base terminal of the transistor Q21 and the resistor R21 through the diode D21, that is, the current supplied to the base terminal of the transistor Q21 and the resistor R21 is increased. Therefore, even if the output transistor 11 becomes the off state to lower the temperature at the sensor output IC 10 to the first predetermined value or less, the transistor Q21 maintained in the on state because of the increase of the current.

The transistor Q21 becomes the off state when the temperature at the sensor output IC 10 is further lowered to the second predetermined value or less. Because the current is passed from the constant current source CC22 through both the transistors Q22 and Q23, the transistors Q22 and Q23 becomes the on state, and therefore the current is passed from the constant current source CC24 to the transistor Q23 to put the transistor Q24 into the off state. Accordingly, because the current is not passed from the constant current source CC11 to the transistor Q24, the driving circuit 14 resumes the operation based on the detection signal.

When the transistor Q22 becomes the on state, because the current is passed from the constant current source CC23 to the transistor Q22, the current supplied to the base terminal of the transistor Q21 and the resistor R21 is returned.

A current source determined by $I21=\Delta V_{BE}/R21$ is used in the temperature-limiting circuit 13 having the above-described configuration. As used herein, $\Delta V_{BE}$ means a difference voltage of $V_{BE}$ depending on an area of the transistor. The features of the current source are that the temperature characteristic is relatively flat and the temperature rise is easily detected because $V_{BE}$ of the transistor has the negative temperature characteristic. Therefore, the current source is desirably used as the temperature-limiting circuit according to one or more embodiments of the present invention.

Then an example of the voltage-limiting circuit 15 in the sensor output IC 10 will be described. As illustrated in FIG. 4, the voltage-limiting circuit 15 includes a constant current source CC31, NPN transistors Q31, Q32, and Q34, a PNP transistor Q33, and resistors R31 and R32.

The transistors Q31 and Q32 and the resistor R31 constitute a current mirror circuit that is provided between the base terminal of the output transistor 11 and the ground wire GND. The collector terminal of the transistor Q32 is connected to the constant current source CC31 and the base terminal of the transistor Q33.

In the transistor Q33, the emitter terminal is connected to the base terminal of the output transistor 11, and the collector terminal is connected to the base terminal of the transistor Q34 and connected to the ground wire GND through the resistor R32. In the transistor Q34, the collector terminal is connected to the base terminal of the output transistor 11, and the emitter terminal is connected to the ground wire GND.

When the output transistor 11 becomes the on state to increase the current passed through the output transistor 11 and the resistor 12, the base potential $V_B$ at the output transistor 11 is increased to increase the current passed through the transistors Q31 and Q32. When the base potential $V_B$ at the output transistor 11 becomes the predetermined value or more, at least a current I31 is passed from the constant current source CC31 to the transistor Q32, the transistor Q33 becomes the on state, and the transistor Q34 becomes the on state. Therefore, the current I11 passed through the transistor Q11 and resistor R11 of the driving circuit 14 is passed to the transistor Q34 to limit the base potential $V_B$ up to the predetermined value, so that the collector current $I_{out}$ of the output transistor 11 can be limited to the current value determined by the predetermined value.

The following equation holds when the transistor Q34 is in the on state:

$$V_{BE}(Q34)=\{(V_B-V_{BE}(Q31))/R31-I31\}\times h_{FE}(Q33)\times R32 \quad \text{(Equation 2)}.$$

Where, $h_{FE}$ is a current amplification factor. The base potential $V_B$ at the output transistor 11 satisfies $V_B=I31\times R31+V_{BE}(Q31)$ by letting $h_{FE}\approx\infty$, and a balance is established. Accordingly, the base potential $V_B$ at the output transistor 11 is kept constant, so that the collector current $I_{out}$ can be kept constant.

Second Example

Figure 5:
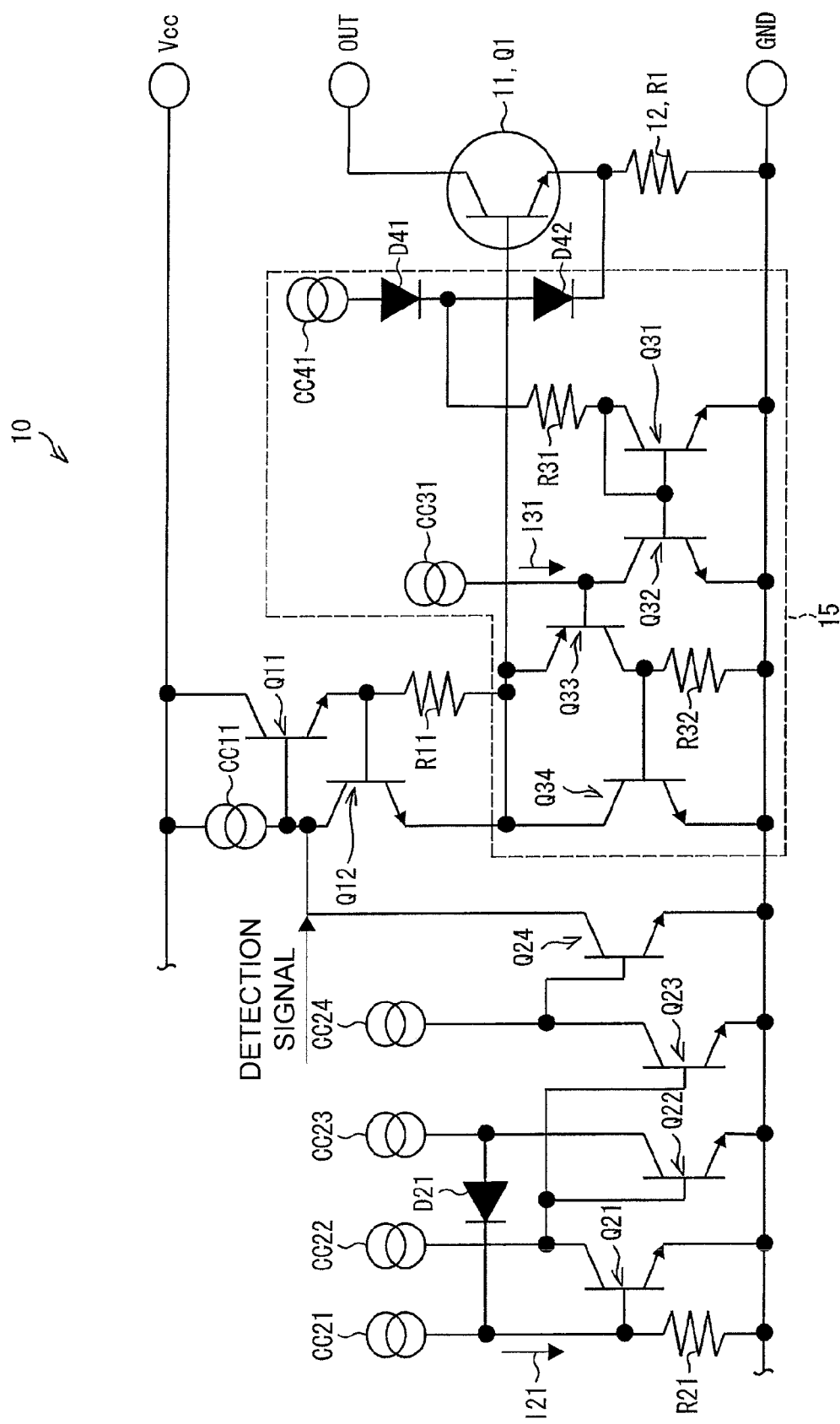
FIG. 5 is a circuit diagram illustrating a second example of the sensor output IC.

FIG. 5 illustrates a second example of a circuit of the sensor output IC 10 of FIG. 1. The second example illustrated in FIG. 5 differs from the first example illustrated in FIG. 4 only in the configuration of the voltage-limiting circuit 15, and other configurations of the second example are identical to those of the first example.

In the first example, the current $I_{out}$ passed through the output transistor 11 is detected by the base potential $V_B$ at the output transistor 11 based on Equation 1. On the other hand, in the second example, the current $I_{out}$ passed through the output transistor 11 is detected by the potential (emitter potential) $V_E$ at the emitter terminal of the output transistor 11. In other words, in the second example, the current $I_{out}$ passed from the output transistor 11 to the resistor 12 is detected by the voltage $V_E$ at the resistor 12. Components having similar functions are designated by the same reference numerals, and the description thereof will not be given.

The voltage-limiting circuit 15 illustrated in FIG. 5 differs from the voltage-limiting circuit 15 illustrated in FIG. 4 in that the connection of the resistor R31 is changed and a constant current source CC41 and diodes D41 and D42 are added. Other configurations of the voltage-limiting circuit 15 illustrated in FIG. 5 are similar to those of the voltage-limiting circuit 15 illustrated in FIG. 4. The constant current source CC41 is connected to the emitter terminal of the output transistor 11 through the diodes D41 and D42. The resistor R31 is connected to a connection point between the diodes D41 and D42.

The emitter potential $V_E$ at the output transistor 11 is increased with increasing current passed through the output transistor 11 and the resistor 12. Therefore, the potential V41 at the connection point between the diodes D41 and D42 is also increased to increase the current passed through the transistors Q31 and Q32. When the emitter potential $V_E$ at the output transistor 11 becomes the predetermined value or more, at least the current I31 is passed from the constant current source CC31 to the transistor Q32, the transistor Q33 becomes the on state, and the transistor Q34 becomes the on state. Accordingly, similarly to the first example, the base potential $V_B$ is limited.

Thus, various circuit configurations of the voltage-limiting circuit 15 can be devised. Similarly, various circuit configurations of the temperature-limiting circuit 13 and the driving circuit 14 can be devised.

The present invention is not limited to the above embodiments, and various changes can be made without departing from the scope of claims.

For example, in one or more embodiments of the present invention, the sensor 120 is provided outside the sensor output IC 10. Alternatively, in one or more embodiments of the present invention, the sensor 120 and the sensor output IC 10 may integrally be provided.

As described above, in the sensor output IC according to one or more embodiments of the present invention, the semiconductor element having the temperature characteristic is utilized to maintain the switching element in the off state when the temperature at the sensor output IC becomes the predetermined value or more, the switching element is protected from the malfunction. Therefore, the sensor output IC according to one or more embodiments of the present invention can be applied to any sensor such as the proximity sensor and the photoelectric sensor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A sensor output IC comprising:
a switching element that turns on and off between output terminals based on a detection signal from a sensor;
a temperature-limiting circuit that maintains the switching element in an off state when a temperature at the sensor output IC becomes a predetermined value or more; and
a driving circuit that supplies a driving current to the switching element or stops the supply of the driving current based on the detection signal,
wherein the switching element becomes an on state when the driving current is supplied, while the switching element becomes the off state when the supply of the driving current is stopped, and
the temperature-limiting circuit performs control so as to stop an operation of the driving circuit when the temperature becomes the predetermined value or more.

2. The sensor output IC according to claim 1, further comprising a voltage-limiting circuit that limits a driving voltage to a predetermined value or less,
wherein a current passed through the switching element in the on state is determined by the driving voltage applied to the switching element.

3. The sensor output IC according to claim 1, wherein the temperature-limiting circuit performs control so as to resume the operation of the driving circuit when a detected temperature becomes another predetermined value that is lower than the predetermined value.

4. The sensor output IC according to claim 2, wherein the temperature-limiting circuit performs control so as to resume the operation of the driving circuit when a detected temperature becomes another predetermined value that is lower than the predetermined value.

5. The sensor output IC according to claim 1, wherein the temperature-limiting circuit is disposed adjacent to the switching element.

6. The sensor output IC according to claim 2, wherein the temperature-limiting circuit is disposed adjacent to the switching element.

7. The sensor output IC according to claim 3, wherein the temperature-limiting circuit is disposed adjacent to the switching element.

8. The sensor output IC according to claim 4, wherein the temperature-limiting circuit is disposed adjacent to the switching element.

9. The sensor output IC according to claim 1, wherein the switching element is a transistor.

10. The sensor output IC according to claim 2, wherein the switching element is a transistor.

11. The sensor output IC according to claim 3, wherein the switching element is a transistor.

12. The sensor output IC according to claim 4, wherein the switching element is a transistor.

13. A sensor device comprising:
a sensor; and
a sensor output IC comprising:
a switching element that turns on and off between output terminals based on a detection signal from the sensor;
a temperature-limiting circuit that maintains the switching element in an off state when a temperature at the sensor output IC becomes a predetermined value or more; and
the sensor output IC according to claim 1, further comprising a driving circuit that supplies a driving current to the switching element or stops the supply of the driving current based on the detection signal,
wherein the switching element becomes an on state when the driving current is supplied, while the switching element becomes the off state when the supply of the driving current is stopped, and
the temperature-limiting circuit performs control so as to stop an operation of the driving circuit when the temperature becomes the predetermined value or more.

* * * * *